United States Patent
Fan et al.

(10) Patent No.: US 11,378,620 B2
(45) Date of Patent: Jul. 5, 2022

(54) METHOD AND SYSTEM FOR DETECTING ABNORMAL DIE

(71) Applicant: Integrated Silicon Solution Inc., Milpitas, CA (US)

(72) Inventors: Shou-Kang Fan, Milpitas, CA (US); Lien-Sheng Yang, Milpitas, CA (US)

(73) Assignee: INTEGRATED SILICON SOLUTION INC., Milpitas, CA (US)

( * ) Notice: Subject to any disclaimer, the term of this patent is extended or adjusted under 35 U.S.C. 154(b) by 77 days.

(21) Appl. No.: 16/944,298

(22) Filed: Jul. 31, 2020

(65) Prior Publication Data
US 2021/0349147 A1   Nov. 11, 2021

(30) Foreign Application Priority Data
May 7, 2020   (TW) .................................. 109115248

(51) Int. Cl.
*G01R 31/28*   (2006.01)
(52) U.S. Cl.
CPC ................................ *G01R 31/2894* (2013.01)
(58) Field of Classification Search
CPC . G01R 31/2894; G01R 31/2853; G01R 31/94
See application file for complete search history.

(56) References Cited

U.S. PATENT DOCUMENTS

| | | | | |
|---|---|---|---|---|
| 6,326,801 | B1* | 12/2001 | Whetsel | G01R 31/31715 324/750.3 |
| 7,492,179 | B2* | 2/2009 | Chiu | G01R 31/31718 324/754.03 |
| 2009/0117673 | A1* | 5/2009 | Matsushita | G05B 23/0229 257/E27.001 |

* cited by examiner

*Primary Examiner* — Bryan Bui
(74) *Attorney, Agent, or Firm* — McClure, Qualey & Rodack, LLP

(57) ABSTRACT

A method for detecting an abnormal die includes providing a wafer, determining the surrounding dies in accordance with a position of a target die on the wafer, calculating a difference between a value of an electrical characteristic of each of the surrounding dies and a value of an electrical characteristic of the target die to obtain the electrical characteristic deviations, ranking the absolute values of the electrical characteristic deviations to generate a ranking result, and determining the characteristic-related dies from the surrounding dies in accordance with the ranking result, determining a target-related area in accordance with the position of the target die, determining the target-related die from the characteristic-related dies in accordance with the target-related area and determining whether the target die is qualified in accordance with the target-related die.

8 Claims, 11 Drawing Sheets

| $CH_{23}$ | $CH_{22}$ | $CH_{21}$ | $CH_{20}$ | $CH_{19}$ |
|---|---|---|---|---|
| $CH_{24}$ | $CH_8$ | $CH_7$ | $CH_6$ | $CH_{18}$ |
| $CH_9$ | $CH_1$ | $CH_T$ | $CH_5$ | $CH_{17}$ |
| $CH_{10}$ | $CH_2$ | $CH_3$ | $CH_4$ | $CH_{16}$ |
| $CH_{11}$ | $CH_{12}$ | $CH_{13}$ | $CH_{14}$ | $CH_{15}$ |

Fig.3

| $CH_{11}$ | $CH_{10}$ | $CH_9$ | $CH_{24}$ | $CH_{23}$ |
| --- | --- | --- | --- | --- |
| $CH_{12}$ | $CH_2$ | $CH_1$ | $CH_8$ | $CH_{22}$ |
| $CH_{13}$ | $CH_3$ | $CH_T$ | $CH_7$ | $CH_{21}$ |
| $CH_{14}$ | $CH_4$ | $CH_5$ | $CH_6$ | $CH_{20}$ |
| $CH_{15}$ | $CH_{16}$ | $CH_{17}$ | $CH_{18}$ | $CH_{19}$ |

Fig.4

| $CH_{23}$ | $CH_{22}$ | $CH_{21}$ | $CH_{20}$ | $CH_{19}$ |
|---|---|---|---|---|
| $CH_{24}$ | $CH_8$ | $CH_7$ | $CH_6$ | $CH_{18}$ |
| $CH_9$ | $CH_1$ | $CH_T$ | $CH_5$ | $CH_{17}$ |
| $CH_{10}$ | $CH_2$ | $CH_3$ | $CH_4$ | $CH_{16}$ |
| $CH_{11}$ | $CH_{12}$ | $CH_{13}$ | $CH_{14}$ | $CH_{15}$ |

Fig.5

| $CH_{23}$ | $CH_{22}$ | $CH_{21}$ | $CH_{20}$ | $CH_{19}$ |
|---|---|---|---|---|
| $CH_{24}$ | $CH_8$ | $CH_7$ | $CH_6$ | $CH_{18}$ |
| $CH_9$ | $CH_1$ | $CH_T$ | $CH_5$ | $CH_{17}$ |
| $CH_{10}$ | $CH_2$ | $CH_3$ | $CH_4$ | $CH_{16}$ |
| $CH_{11}$ | $CH_{12}$ | $CH_{13}$ | $CH_{14}$ | $CH_{15}$ |

Fig.6

| CH₈ | CH₇ | CH₆ |
| CH₁ | CHₜ | CH₅ |
| CH₂ | CH₃ | CH₄ |

|     |                  |                  |                  |                  |                  |     |
|-----|------------------|------------------|------------------|------------------|------------------|-----|
|     |                  |                  |                  |                  |                  |     |
|     | $CH_{23}$        | $CH_{22}$ ✕      | $CH_{21}$        | $CH_{20}$        | $CH_{19}$        |     |
|     | $CH_{24}$        | $CH_8$           | $CH_7$           | $CH_6$           | $CH_{18}$ ✕      |     |
| $CH_{25}$ | $CH_9$     | $CH_1$           | $CH_T$           | $CH_5$           | $CH_{17}$        |     |
| $CH_{26}$ | $CH_{10}$  | $CH_2$           | $CH_3$           | $CH_4$           | $CH_{16}$ ✕      |     |
| $CH_{27}$ | $CH_{11}$  | $CH_{12}$        | $CH_{13}$ ✕      | $CH_{14}$        | $CH_{15}$        |     |
| $CH_{28}$ |            |                  |                  |                  |                  |     |

METHOD AND SYSTEM FOR DETECTING ABNORMAL DIE

RELATED APPLICATIONS

This application claims priority to Taiwan Application Serial Number 109115248, filed May 7, 2020, which is herein incorporated by reference.

BACKGROUND

Technical Field

The present disclosure relates to a method and a system for detecting an abnormal die.

Description of Related Art

With the rapid developments of technology, the manufacturing technique of integrated circuit has gradually improved. In the manufacturing process of integrated circuit, the wafer will be processed by many steps, so as to form a die on the wafer. In order to make sure the die work, the die will be tested many times, to ensure the operating parameter of the die can meet the predetermined requirement. However, the die passes the test which may have undetected potential defect.

At present, the abnormal die which may have potential defect is examined by Part Average Testing. However, Part Average Testing cannot satisfy the requirement.

SUMMARY

According to one aspect of the present disclosure, a method for detecting an abnormal die includes steps as follows. The steps include providing a wafer. The steps include determining a plurality of surrounding dies in accordance with a position of a target die on the wafer. The steps include calculating a difference between a value of an electrical characteristic of each of the surrounding dies and a value of an electrical characteristic of the target die to obtain a plurality of electrical characteristic deviations, and each of the electrical characteristic deviations correspond to each of the surrounding dies. The steps include ranking a plurality of absolute values of the electrical characteristic deviations to generate a ranking result, and determining a plurality of characteristic-related dies from the surrounding dies in accordance with the ranking result. The steps include determining a target-related area in accordance with the position of the target die. The steps include determining at least one target-related die from the characteristic-related dies in accordance with the target-related area. The steps include determining whether the target die is qualified in accordance with the at least one target-related die.

According to another aspect of the present disclosure, a system for detecting an abnormal die includes a test machine and a computer. The test machine is configured to receive a wafer, the wafer includes a plurality of dies and the test machine is configured to obtain a value of electrical characteristic of each of the dies. The computer system is electrically connected to the test machine, and the computer system is configured to implement a method for detecting the abnormal die includes steps as follows. The steps include determining a plurality of surrounding dies in accordance with a position of a target die one the wafer, the target die is one of the dies, the surrounding dies are a plurality of the dies. The steps include calculating a difference between a value of an electrical characteristic of each of the surrounding dies and a value of an electrical characteristic of the target dies to obtain a plurality of electrical characteristic deviations, each of the electrical characteristic deviations corresponds to each of the surrounding dies. The steps include ranking a plurality of absolute values of the electrical characteristic deviations to generate a ranking result, and determining a plurality of characteristic-related dies from the surrounding dies in accordance with the ranking result. The steps include determining a target-related area in accordance with the position of the target die. The steps include determining at least one target-related die from the characteristic-related dies in accordance with the target-related area. The steps include determining whether target die is qualified in accordance with the at least one target-related die.

BRIEF DESCRIPTION OF THE DRAWINGS

The present disclosure can be more fully understood by reading the following detailed description of the embodiment, with reference made to the accompanying drawings as follows:

FIG. 3 is a schematic view of a plurality of dies of a partial area of a wafer according to one embodiment of the present disclosure.

FIG. 4 is a schematic view of determining a plurality of surrounding dies according to a first embodiment of the present disclosure.

FIG. 5 is a schematic view of a plurality of characteristic-related dies according to one embodiment of the present disclosure.

FIG. 6 is a schematic view of a target-related area according to one embodiment of the present disclosure.

FIG. 7 is a schematic view of a target-related die according to one embodiment of the present disclosure.

FIG. 8 is a schematic view of determining the surrounding dies according to a second embodiment of the present disclosure.

FIG. 9a is a schematic view of determining the surrounding dies according to a third embodiment of the present disclosure.

DETAILED DESCRIPTION

The embodiment will be described with the drawings. For clarity, some practical details will be described below. However, it should be noted that the present disclosure should not be limited by the practical details, that is, in some embodiments, the practical details is unnecessary. In addition, for simplifying the drawings, some conventional structures and elements will be simply illustrated, and repeated elements may be represented by the same labels.

Figure 1:
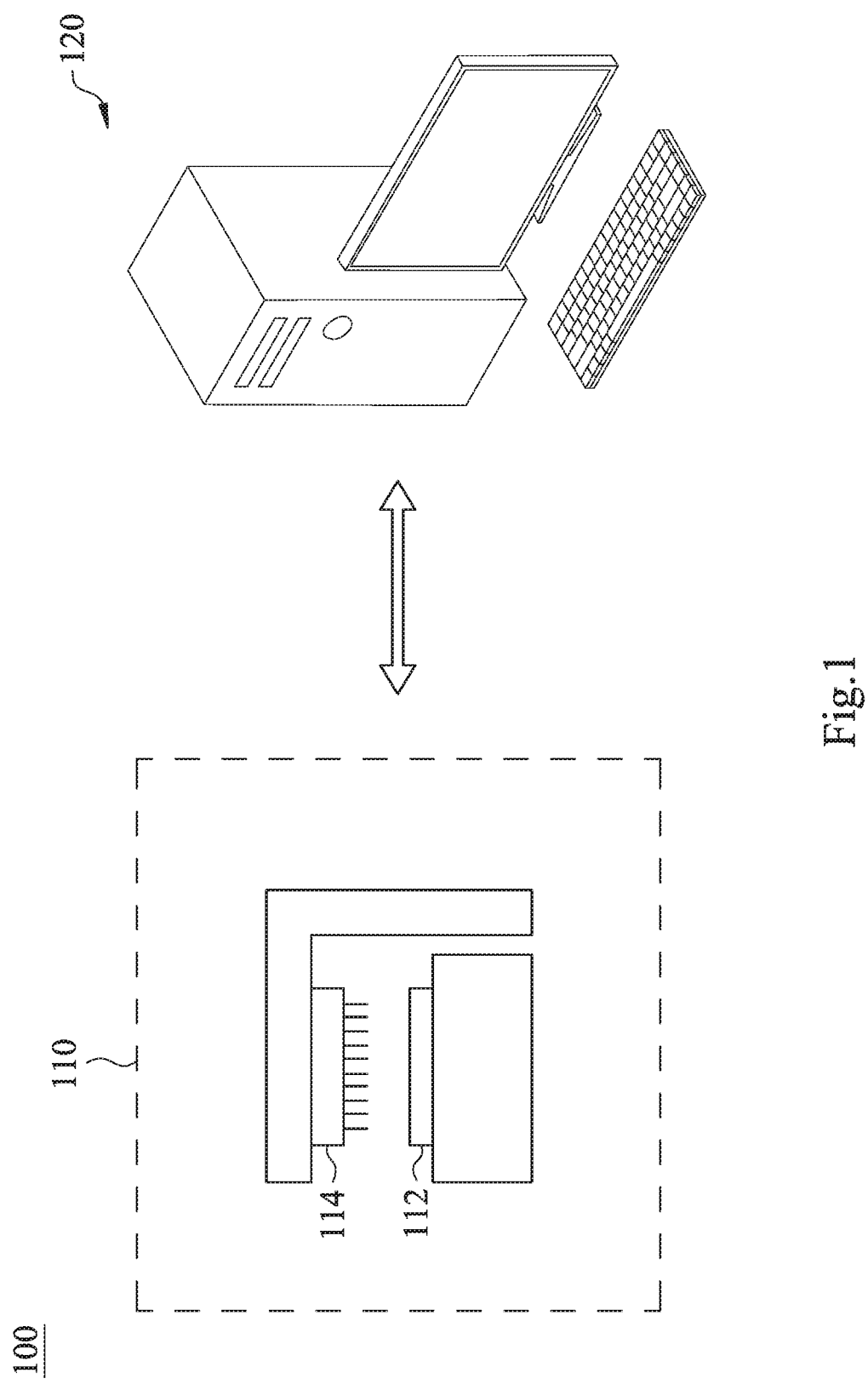
FIG. 1 is a schematic view of the system for detecting an abnormal die according to one embodiment of the present disclosure.

FIG. 1 is a schematic view of the system 100 for detecting an abnormal die according to one embodiment of the present disclosure. The system 100 for detecting the abnormal die includes a test machine 110 and a computer system 120. The test machine 110 is configured to test a plurality of dies on the wafer 112, to obtain a testing data of each of the dies. In other embodiments of the present disclosure, the die on the wafer 112 is a memory chip, such as a dynamic random access memory (DRAM) chip. The computer system 120 is electrically connected to the test machine 110, to obtain the testing data of the memory chip and analyze the testing data.

In one embodiment of the present disclosure, the testing machine 110 includes a probe device 114. The probe device 114 gives an electrical signal to the memory chip of the wafer 112 and obtains the testing data of the memory chip. The testing data can include a position of the memory chip and a value of an electrical characteristic of the memory chip, such as a current or a voltage having an electrical characteristic value distributed continuously, but is not limited thereto.

Figure 2:
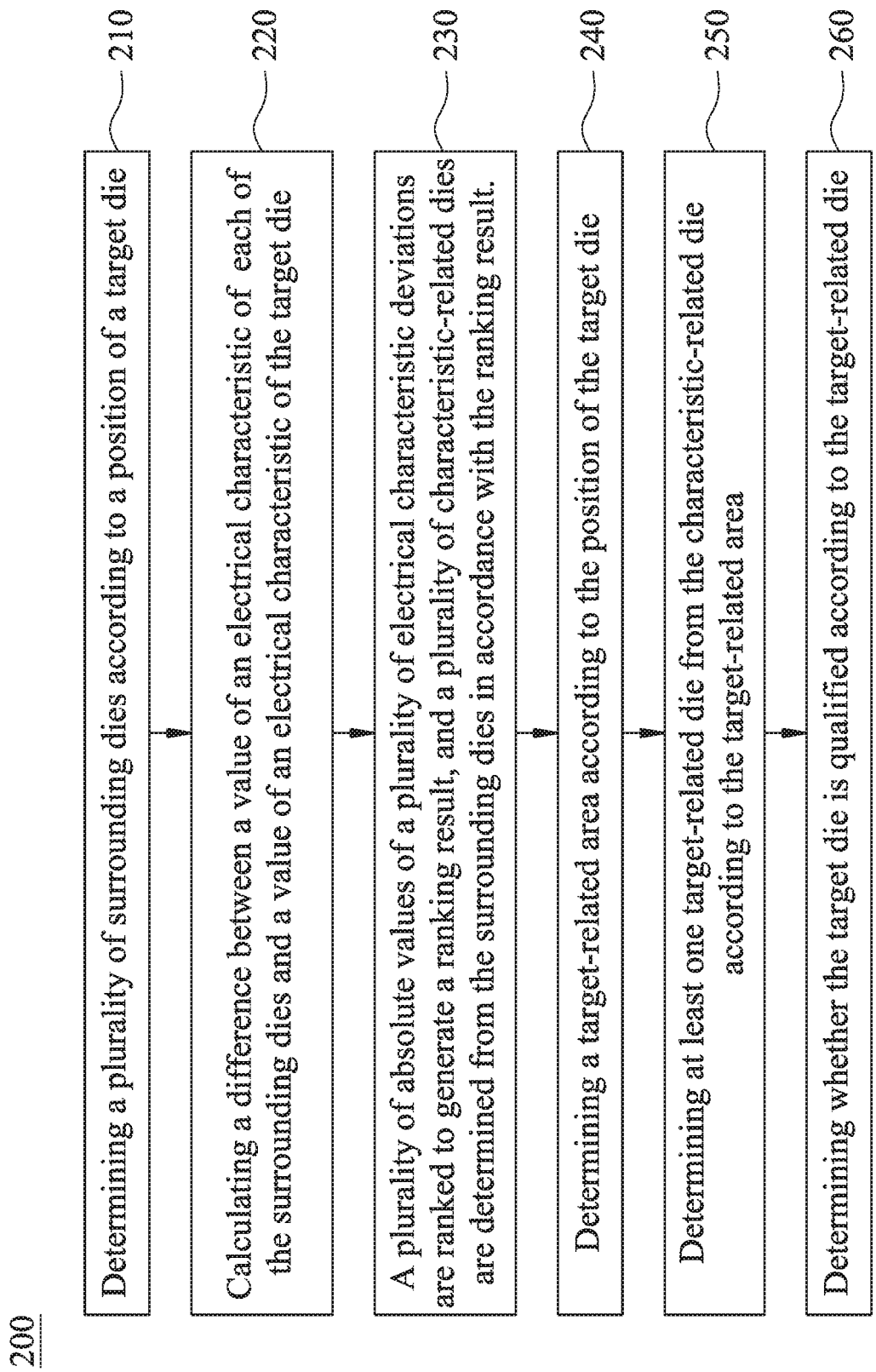
FIG. 2 is a flow chart of the method for detecting the abnormal die according to one embodiment of the present disclosure.

FIG. 2 is a flow chart of the method 200 for detecting the abnormal die according to one embodiment of the present disclosure. The method 200 for detecting the abnormal die is performed by the computer system 120, to detect the target die on the wafer 112. In the method 200 for detecting the abnormal die, a step 210 is performed at first so as to determine a plurality of surrounding dies of the target die in accordance with the position of the target die on the wafer 112, as shown in FIG. 3. FIG. 3 is a schematic view of a plurality of dies of a partial area of the wafer 112 according to one embodiment of the present disclosure. The die of the partial area of the wafer 112 includes a target die $CH_T$ and the surrounding dies $CH_1$-$CH_{24}$. The target die $CH_T$ is a high-risk die of the wafer 112. In one embodiment of the present disclosure, the high-risk die is determined by the dynamic part average testing (D-PAT), but is not limited thereto. In other embodiments of the present disclosure, the high-risk die can be determined by other methods.

FIG. 4 is a schematic view of determining the surrounding dies according to a first embodiment of the present disclosure. In FIG. 4, the surrounding dies $CH_1$-$CH_{24}$ are 24 dies which are circle around from the top of the target die $CH_T$ in sequence. However, embodiments of the present disclosure are not limited in choosing 24 dies. In other embodiments of the present disclosure, the number of the surrounding dies can be adjusted by the requirement of the user.

In FIG. 2, a step 220 is performed after the step 210. The step 220 is configured to calculate a difference between a value of an electrical characteristic of each of the surrounding dies $CH_1$-$CH_{24}$ and a value of an electrical characteristic of the target die $CH_T$. For example, calculating the difference between a current of each of the surrounding dies $CH_1$-$CH_{24}$ and a current of the target die $CH_T$. Therefore, 24 electrical characteristic deviations of the surrounding dies $CH_1$-$CH_{24}$ and the target die $CH_T$ can be obtained, such as each of the current deviations corresponds $i_1$-$i_{24}$ to each of the surrounding dies $CH_1$-$CH_{24}$.

A step 230 is performed after the step 220. In the step 230, a plurality of absolute values of the electrical characteristic deviations are ranked to generate a ranking result, and a plurality of characteristic-related dies are determined from the surrounding dies $CH_1$-$CH_{24}$ in accordance with the ranking result. FIG. 5 is a schematic view of the 8 characteristic-related die $CH_1$, $CH_3$, $CH_4$, $CH_5$, $CH_6$, $CH_9$, $CH_{15}$ and $CH_{21}$ according to one embodiment of the present disclosure. In the step 230 of the embodiment, obtaining the absolute values of the aforementioned 24 electrical characteristic deviations, and ranking the absolute values in an ascending way. For example, the absolute values of the 24 electrical characteristic deviations ranked in the ascending way are $|i_1|$, $|i_3|$, $|i_4|$, $|i_5|$, $|i_6|$, $|i_9|$, $|i_{15}|$, $|i_{21}|$ . . . $|i_{24}|$. The smaller the absolute value of the electrical characteristic deviations, the closer the electrical characteristic, so that the surrounding die $CH_1$ corresponding to $|i_3|$ is the closest to the electrical characteristic of the target die $CH_T$, and the surrounding die $CH_{24}$ corresponding to $|i_{24}|$ is the farthest from the electrical characteristic deviation of the target die $CH_T$. The 8 characteristic-related dies are determined by closer electrical characteristic in accordance with the ranking result. According to the aforementioned ranking result, $|i_1|$, $|i_3|$, $|i_4|$, $|i_5|$, $|i_6|$, $|i_9|$, $|i_{15}|$, and $|i_{21}|$ are 8 electrical characteristic deviations with smaller value. Therefore, the surrounding dies $CH_1$, $CH_3$, $CH_4$, $CH_5$, $CH_6$, $CH_9$, $CH_{15}$ and $CH_{21}$ correspond thereto are the characteristic-related dies.

A step 240 is performed after the step 230. The step 240 is configured to determine a target-related area in accordance with the position of the target die $CH_T$. FIG. 6 is a schematic view of the target-related area 600 according to one embodiment of the present disclosure. In the embodiment, the step 240 is configured to choose 8 positions of the dies around the position of the target die $CH_T$ as the target-related area. Moreover, the step 240 is performed after the step 230, but the present disclosure is not limited thereto. In other embodiments of the present disclosure, the step 240 can be performed before the step 210, or the step 240 can be performed between other steps.

Figure 7:
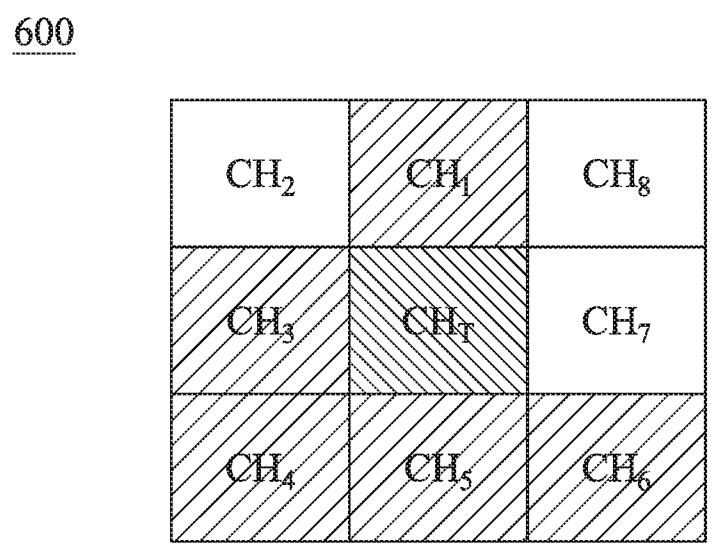

A step 250 is performed after the step 240, the step 250 is configured to determine at least one target-related die from the characteristic-related dies $CH_1$, $CH_3$, $CH_4$, $CH_5$, $CH_6$, $CH_9$, $CH_{15}$ and $CH_{21}$ in accordance with the target-related area 600. In the step 250, judging which one of the characteristic-related dies $CH_1$, $CH_3$, $CH_4$, $CH_5$, $CH_6$, $CH_9$, $CH_{15}$ and $CH_{21}$ is over the target-related area 600, and determining the characteristic-related die over the target-related area 600 as a target-related die. In FIG. 7, the characteristic-related dies $CH_1$, $CH_3$, $CH_4$, $CH_5$ and $CH_6$ are over the target-related area 600, thus the characteristic-related dies $CH_1$, $CH_3$, $CH_4$, $CH_5$ and $CH_6$ are determined as the target-related dies.

A step 260 is performed after the step 250, the step 260 is configured to determine whether the target die $CH_T$ is qualified in accordance with the target-related dies $CH_1$, $CH_3$, $CH_4$, $CH_5$ and $CH_6$. In the step 260, judging whether a number of the target-related die is more than a predetermined value. When the number of the target-related dies is more than the predetermined value, the target die $CH_T$ has a potential risk, hence the target die $CH_T$ is determined to be unqualified. In the embodiment, the predetermined value is 3. Because the number of the target-related dies is 5, the target die $CH_T$ is unqualified. In other embodiments of the present disclosure, the step 260 further includes judging whether the number of the target-related die is 0. When the number of the target-related die is 0, the target die $CH_T$ also has a potential risk, hence the target die $CH_T$ is determined to be unqualified.

According to the aforementioned embodiment, the electrical characteristic and the position are taken into consideration in the method 200 for detecting the abnormal die of the present disclosure, hence the possibility of detecting the abnormal die can be increased, and the efficiency of detecting die can also be increased.

FIG. 8 is a schematic view of determining the surrounding dies of the step 210 according to a second embodiment of the present disclosure. In the embodiment, not all the dies are normal and the value of the electrical characteristic can be read, the dies (invalid dies) which cannot be read will be jumped over and replaced by other dies. In the embodiment of FIG. 8, the dies $CH_{13}$, $CH_{18}$, $CH_{18}$ and $CH_{22}$ are invalid dies, 4 substitute dies $CH_{25}$, $CH_{26}$, $CH_{27}$ and $CH_{28}$ which are circle around from the top of the target die $CH_9$ are chosen to replace the invalid dies $CH_{13}$, $CH_{16}$, $CH_{18}$ and $CH_{22}$. Thus, the step 210 can still provide 24 surrounding dies.

Figure 9A:
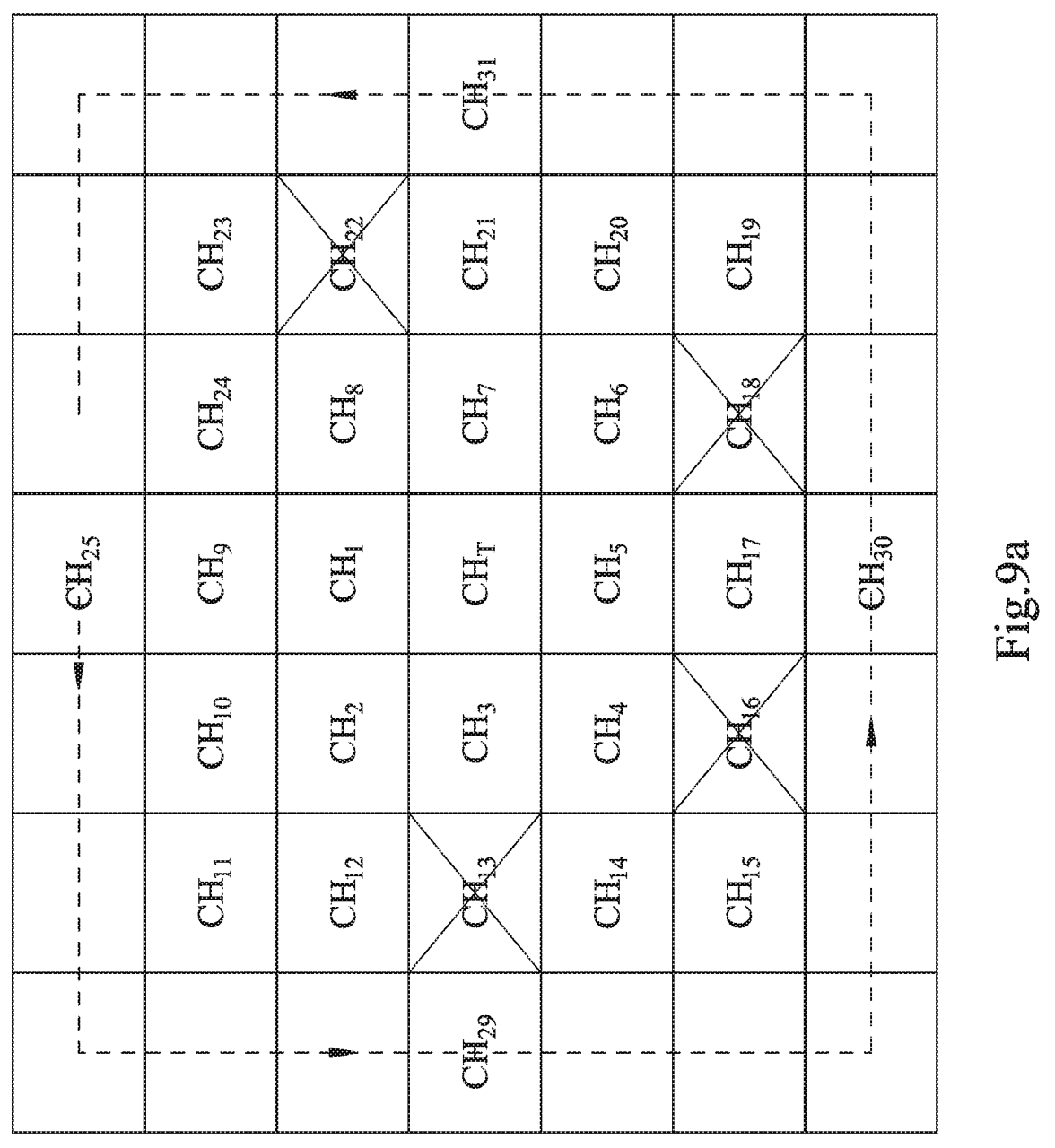

FIG. 9a is a schematic view of determining the surrounding dies of the step 210 according to a third embodiment of the present disclosure. The way of choosing the surrounding dies of the embodiment is similar to the aforementioned embodiment, but the way of choosing substitute dies is different from choosing the dies one by one in sequence. Choosing a die and jumping over a certain number of dies and choosing another substitute die. For example, choosing a substitute die $CH_{25}$ above the die $CH_9$, and choosing another substitute die $CH_{29}$ after jump over 5 dies in sequence, and choosing further another substitute die $CH_{30}$ after jump over 5 dies, and then choosing the other substitute die $CH_{31}$ after jump over 5 dies. Thus, the substitute dies $CH_{25}$, $CH_{29}$, $CH_{30}$ and $CH_{31}$ replace the invalid dies $CH_{13}$, $CH_{16}$, $CH_{18}$ and $CH_{22}$.

Figure 9B:
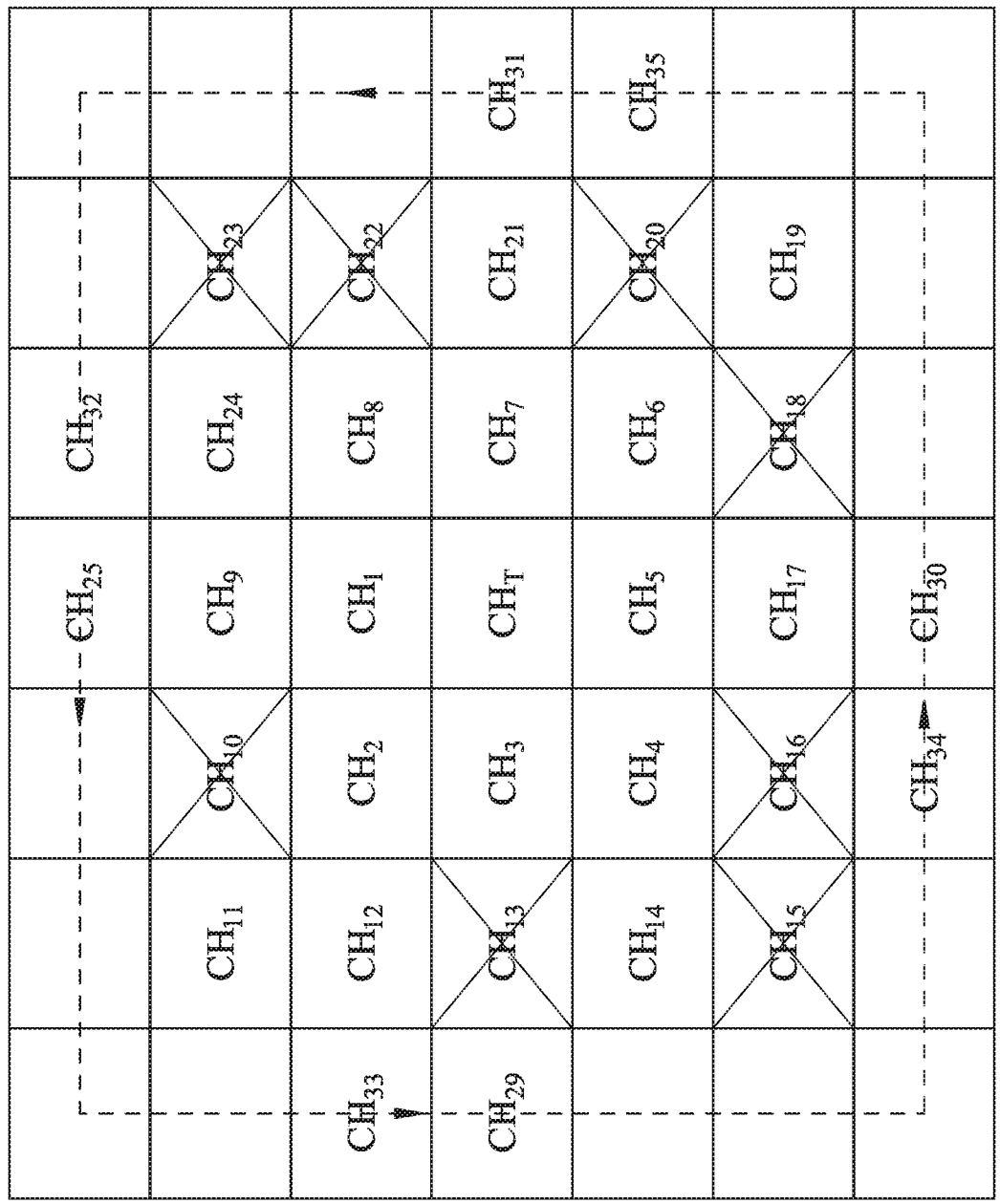
FIG. 9b is a schematic view of determining the surrounding dies according to a fourth embodiment of the present disclosure.

FIG. 9b is a schematic view of determining the surrounding dies of the step 210 according to a fourth embodiment of the present disclosure. When the number of the invalid dies is even more than the number of the invalid dies of the aforementioned embodiment, after choosing the substitute dies $CH_{25}$, $CH_{29}$, $CH_{30}$ and $CH_{31}$ in sequence, choosing a die $CH_{32}$ on the upper-right side of the die $CH_9$, and choosing a substitute die $CH_{33}$ after jump over 5 dies in sequence, and choosing another substitute die $CH_{34}$ after jump over 5 dies in sequence, and choosing further another substitute die $CH_{35}$ after jump over 5 dies in sequence. Thus, the substitute dies $CH_{25}$, $CH_{29}$, $CH_{30}$, $CH_{31}$, $CH_{32}$, $CH_{33}$, $CH_{34}$ and $CH_{35}$ replace the invalid dies $CH_{10}$, $CH_{13}$, $CH_{15}$, $CH_{16}$, $CH_{18}$, $CH_{20}$, $CH_{22}$ and $CH_{23}$.

Figure 9C:
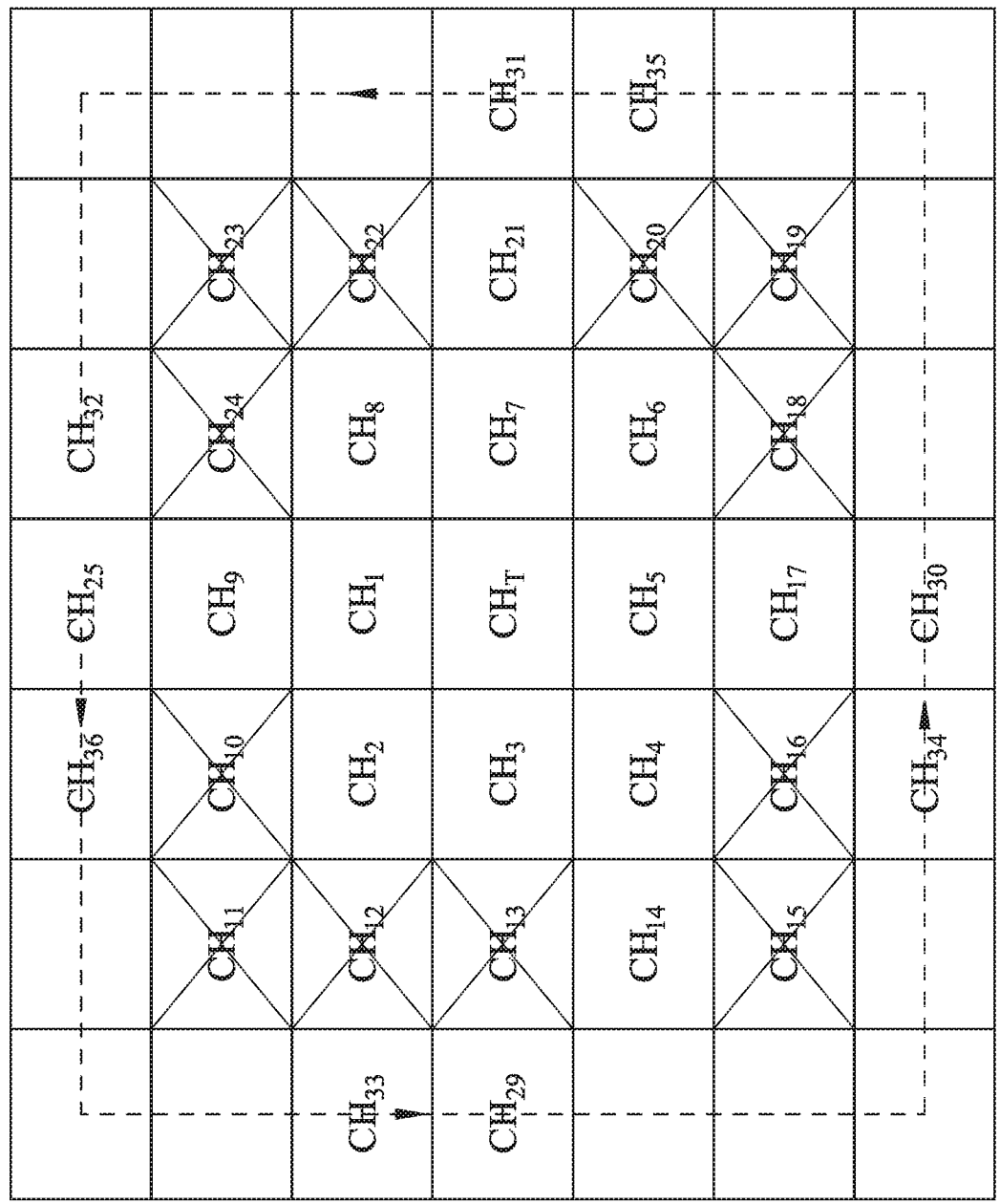
FIG. 9c is a schematic view of determining the surrounding dies according to a fifth embodiment of the present disclosure.

FIG. 9c is a schematic view of determining the surrounding dies of the step 210 according to a fifth embodiment of the present disclosure. When further more invalid dies are on the wafer, after choosing the substitute dies $CH_{32}$, $CH_{33}$, $CH_{34}$ and $CH_{35}$ in sequence, choosing a die $CH_{36}$ on the upper-left side of the die $CH_9$, and choosing a substitute die $CH_{37}$ after jump over 5 dies in sequence, and choosing another substitute die $CH_{38}$ after jump over 5 dies in sequence, and choosing further another substitute die $CH_{39}$ after jump over 5 dies in sequence. Thus, the substitute dies $CH_{25}$, $CH_{29}$, $CH_{30}$, $CH_{31}$, $CH_{32}$, $CH_{33}$, $CH_{34}$, $CH_{35}$, $CH_{36}$, $CH_{37}$, $CH_{38}$ and $CH_{39}$ replace the invalid dies $CH_{10}$, $CH_{11}$, $CH_{12}$, $CH_{13}$, $CH_{15}$, $CH_{16}$, $CH_{18}$, $CH_{19}$, $CH_{20}$, $CH_{22}$, $CH_{23}$ and $CH_{24}$.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for detecting an abnormal die, comprising:
   providing a test machine for receiving a wafer, the wafer comprising a plurality of dies, wherein the test machine is configured to obtain a value of electrical characteristic of each of the dies;
   determining, by a computer system, a plurality of surrounding dies in accordance with a position of a target die on the wafer, wherein the target die is one of the dies, and the surrounding dies are a plurality of the dies;
   calculating, by the computer system, a difference between a value of an electrical characteristic of each of the surrounding dies and a value of an electrical characteristic of the target die to obtain a plurality of electrical characteristic deviations, wherein the electrical characteristic deviations correspond to the surrounding dies, respectively;
   ranking, by the computer system, a plurality of absolute values of the electrical characteristic deviations to generate a ranking result, and determining a plurality of characteristic-related dies from the surrounding dies in accordance with the ranking result;
   determining, by the computer system, a target-related area in accordance with the position of the target die;
   determining, by the computer system, at least one target-related die from the characteristic-related dies in accordance with the target-related area; and
   determining, by the computer system, whether the target die is qualified in accordance with the at least one target-related die, and comprising: judging whether a number of the at least one target-related die is more than a predetermined value;
   wherein when the number of the at least one target-related die is more than the predetermined value, the target die is determined to be unqualified as the abnormal die.

2. The method for detecting the abnormal die of claim 1, wherein the surrounding dies surround the target die.

3. The method for detecting the abnormal die of claim 1, wherein the target-related area comprises the positions of the eight dies which are connected to the position of the target die.

4. The method for detecting the abnormal die of claim 1, wherein a step of determining the at least one target-related die from the characteristic-related dies in accordance with the target-related area comprises:
   judging whether one of the characteristic-related dies is in the target-related area;
   wherein when the one of the characteristic-related dies is in the target-related area, the one of the characteristic-related dies is determined to be the at least one target-related die.

5. A system for detecting an abnormal die, comprising:
   a test machine, configured for receiving a wafer, the wafer comprising a plurality of dies, wherein the test machine is configured to obtain a value of electrical characteristic of each of the dies; and
   a computer system, electrically connected to the test machine, wherein the computer system is configured to implement a method for detecting the abnormal die comprising:
      determining a plurality of surrounding dies in accordance with a position of a target die on the wafer, wherein the target die is one of the dies, the surrounding dies are a plurality of the dies;
      calculating a difference between a value of an electrical characteristic of each of the surrounding dies and a value of an electrical characteristic of the target dies to obtain a plurality of electrical characteristic deviations, wherein the electrical characteristic deviations correspond to the surrounding dies, respectively;
      ranking a plurality of absolute values of the electrical characteristic deviations to generate a ranking result, and determining a plurality of characteristic-related dies from the surrounding dies in accordance with the ranking result;

determining a target-related area in accordance with the position of the target die;

determining at least one target-related die from the characteristic-related dies in accordance with the target-related area; and determining whether the target die is qualified in accordance with the at least one target-related die, and comprising: judging whether a number of the at least one target-related die is more than a predetermined value;

wherein when the number of the at least one target-related die is more than the predetermined value, the target die is determined to be unqualified as the abnormal die.

6. The system for detecting the abnormal die of claim 5, wherein the surrounding dies surround the target die.

7. The system for detecting the abnormal die of claim 5, wherein the target-related area comprises the positions of the eight dies which are connected to the position of the target die.

8. The system for detecting the abnormal die of claim 5, wherein the computer system is configured to implement a method for determining the at least one target-related die from the characteristic-related dies in accordance with the target-related area comprising:

judging whether one of the characteristic-related dies is in the target-related area;

wherein when the one of the characteristic-related dies is in the target-related area, the one of the characteristic-related dies is determined to be the at least one target-related die.

* * * * *